United States Patent
Matsumoto

(10) Patent No.: US 9,478,391 B2
(45) Date of Patent: *Oct. 25, 2016

(54) CHARGED PARTICLE BEAM WRITING APPARATUS AND CHARGED PARTICLE BEAM WRITING METHOD

(71) Applicant: NuFlare Technology, Inc., Yokohama (JP)

(72) Inventor: Hironobu Matsumoto, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/620,402

(22) Filed: Feb. 12, 2015

(65) Prior Publication Data

US 2015/0279611 A1  Oct. 1, 2015

(30) Foreign Application Priority Data

Mar. 26, 2014 (JP) ................. 2014-064628

(51) Int. Cl.
  *H01J 37/147* (2006.01)
  *H01J 37/317* (2006.01)

(52) U.S. Cl.
  CPC .......... *H01J 37/147* (2013.01); *H01J 37/3174* (2013.01); *H01J 37/3175* (2013.01);
  (Continued)

(58) Field of Classification Search
  CPC ................ H01J 2237/31762; H01J 37/3026; H01J 37/3174; H01J 2237/1504; H01J 2237/31764; H01J 37/147; H01J 37/3175; H01J 2237/31754; H01J 2237/31776; H01J 37/02; H01J 37/153; H01J 37/20; B82Y 10/00; B82Y 40/00; Y10S 430/143

USPC ....... 250/396 R, 397, 492.1, 492.2; 700/1, 2, 700/4, 7

See application file for complete search history.

(56) References Cited

U.S. PATENT DOCUMENTS 9,153,420 B2 * 10/2015 Yashima ............. H01J 37/3174
2008/0221816 A1   9/2008 Anpo et al.
(Continued)

FOREIGN PATENT DOCUMENTS

JP    7-130602 A   5/1995
JP    2008-218767  9/2008
(Continued)

OTHER PUBLICATIONS

Office Action issued Dec. 10, 2015 in Korean Patent Application No. 10-2015-0039882 (with English language translation).
(Continued)

Primary Examiner — Dionne H Pendleton
(74) Attorney, Agent, or Firm — Oblon, McClelland, Maier & Neustadt, L.L.P.

(57) ABSTRACT

A charged particle beam writing apparatus includes plural conversion processing units to perform data conversion processing in parallel for writing data of each processing region obtained by virtually dividing the writing region of a target object into plural processing regions, a transmission unit to input a part of processing data of one of the plural processing regions for which data conversion processing has been performed, one part at a time, totally as n divided processing data, and sequentially transmit the n divided processing data such that the (n−1) th divided processing data is transmitted while the n-th divided processing data is being input, a deflection control circuit to control a deflection amount for deflecting a charged particle beam, based on one of the n divided processing data transmitted sequentially, and a writing unit to write a pattern by deflecting the charged particle beam based on the deflection amount.

10 Claims, 8 Drawing Sheets

(52) U.S. Cl.
CPC ............... *H01J2237/1504* (2013.01); *H01J 2237/31762* (2013.01); *H01J 2237/31764* (2013.01); *H01J 2237/31776* (2013.01)

(56) References Cited

U.S. PATENT DOCUMENTS

| | | | |
|---|---|---|---|
| 2011/0066272 A1 | 3/2011 | Anpo | |
| 2012/0248340 A1 | 10/2012 | Inoue | |
| 2012/0312975 A1* | 12/2012 | Kobayashi | B82Y 40/00 250/252.1 |
| 2013/0288181 A1* | 10/2013 | Sugiyama | H01J 37/3174 430/296 |
| 2014/0021655 A1* | 1/2014 | Hirata | H01J 37/304 264/406 |
| 2015/0014549 A1* | 1/2015 | Yashima | H01J 37/3174 250/396 R |

FOREIGN PATENT DOCUMENTS

| | | |
|---|---|---|
| JP | 2012-212829 | 11/2012 |
| KR | 10-2011-0030344 A | 3/2011 |

OTHER PUBLICATIONS

Office Action issued May 31, 2016 in Korean Patent Application No. 10-2015-0039882 (with English language translation).

Korean Office Action, Decision of Refusal, dated Jul. 27, 2016, issued by the Korean Intellectual Property Office (KIPO) in corresponding Korean Patent Application No. 10-2015-0039882, with English translation (8 pages).

* cited by examiner

Transmission Order List (Import Request List)

| DPB.ID. | CONV.ID. |
|---------|----------|
| 31,1,2  | A        |
| 32,1,2  | B        |
| 33,1,2  | C        |
| ⋮       | ⋮        |

CHARGED PARTICLE BEAM WRITING APPARATUS AND CHARGED PARTICLE BEAM WRITING METHOD

CROSS-REFERENCE TO RELATED APPLICATION

This application is based upon and claims the benefit of priority from the prior Japanese Patent Application No. 2014-064628 filed on Mar. 26, 2014 in Japan, the entire contents of which are incorporated herein by reference.

BACKGROUND OF THE INVENTION

1. Field of the Invention

Embodiments of the present invention relate generally to a charged particle beam writing apparatus and a charged particle beam writing method, and more specifically, relate to, for example, a writing apparatus and method that performs transmission processing of writing data in real time in accordance with advance of writing processing.

2. Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is decreasing year by year. For forming a desired circuit pattern on such semiconductor devices, a master or "original" pattern (also called a mask or a reticle) of high accuracy is needed. Thus, the electron beam (EB) writing technique, which intrinsically has excellent resolution, is used for producing such a high-precision master pattern.

FIG. 9 is a conceptual diagram explaining operations of a variable shaped electron beam writing or "drawing" apparatus. The variable shaped electron beam (EB) writing apparatus operates as described below. A first aperture plate 410 has a quadrangular aperture 411 for shaping an electron beam 330. A second aperture plate 420 has a variable shape aperture 421 for shaping the electron beam 330 having passed through the aperture 411 of the first aperture plate 410 into a desired quadrangular shape. The electron beam 330 emitted from a charged particle source 430 and having passed through the aperture 411 is deflected by a deflector to pass through a part of the variable shape aperture 421 of the second aperture plate 420, and thereby to irradiate a target object or "sample" 340 placed on a stage which continuously moves in one predetermined direction (e.g., the x direction) during writing. In other words, a quadrangular shape that can pass through both the aperture 411 of the first aperture plate 410 and the variable shape aperture 421 of the second aperture plate 420 is used for pattern writing in a writing region of the target object 340 on the stage continuously moving in the x direction. This method of forming a given shape by letting beams pass through both the aperture 411 of the first aperture plate 410 and the variable shape aperture 421 of the second aperture plate 420 is referred to as a variable shaped beam (VSB) system.

In an electron beam writing apparatus, it is conventionally performed that writing data input from outside the apparatus is divided per predetermined calculation region so as to be allocated to a plurality of computers, and data conversion processing is performed in parallel in the plurality of computers in order to reduce a processing time for data conversion (refer to, e.g., Japanese Application Laid-open (JP-A) No. 2008-218767). Then, data for which data conversion processing has been performed in parallel is once input into a transmission processing device, and transmitted, in order of writing, to a deflection control circuit. Based on such data, the amount of beam deflection is determined so as to irradiate a target object with a deflected beam.

In a writing apparatus, it is requested to perform data transmission to the deflection control circuit without any delay, and thus to advance writing processing smoothly. However, if data transmission from a transmission processing device to a deflection control circuit is delayed and data for a writing region concerned is disconnected during the writing, the writing processing is once stopped. In an electron beam writing apparatus, when writing is performed while the stage is moving, if transmission of data for writing is delayed and the writing processing is once stopped, the stage position needs to be returned to a position where writing was performed accurately, and then, after the data for writing reaches, writing is started again. Therefore, there is a problem if the operation is once stopped, time needs to be spent in restoring the state from the stopping, which makes the writing time long.

BRIEF SUMMARY OF THE INVENTION

According to one aspect of the present invention, a charged particle beam writing apparatus includes a plurality of conversion processing units configured to perform data conversion processing in parallel for writing data of each processing region obtained by virtually dividing a writing region of a target object into a plurality of processing regions; a transmission unit configured to input apart of processing data of one of the plurality of processing regions for which the data conversion processing has been performed, one part at a time, totally as n divided processing data, and sequentially transmit the n divided processing data in a manner such that an (n−1) th divided processing data is transmitted while an n-th divided processing data is being input; a deflection control circuit configured to control a deflection amount for deflecting a charged particle beam, based on one of the n divided processing data transmitted sequentially; and a writing unit configured to write a pattern on a target object by deflecting the charged particle beam based on the deflection amount.

According to another aspect of the present invention, a charged particle beam writing method includes performing data conversion processing in parallel for writing data of each processing region obtained by virtually dividing a writing region of a target object into a plurality of processing regions; inputting a part of processing data of one of the plurality of processing regions for which the data conversion processing has been performed, one part at a time, totally as n divided processing data, and sequentially transmitting the n divided processing data to a deflection control circuit in a manner such that an (n−1) th divided processing data is transmitted while an n-th divided processing data is being input; calculating, by the deflection control circuit, a deflection amount for deflecting a charged particle beam, based on one of the n divided processing data transmitted sequentially; and writing a pattern on a target object by deflecting the charged particle beam based on the deflection amount.

DETAILED DESCRIPTION OF THE INVENTION

In the following embodiments, there will be described a configuration in which an electron beam is used as an example of a charged particle beam. The charged particle beam is not limited to the electron beam, and other charged particle beam such as an ion beam may also be used. Moreover, a variable shaped electron beam writing apparatus will be described as an example of a charged particle beam apparatus.

In the embodiments described below, a writing apparatus and method that can perform data transmission to a deflection control circuit without any delay and perform writing processing smoothly will be explained.

First Embodiment

Figure 1:
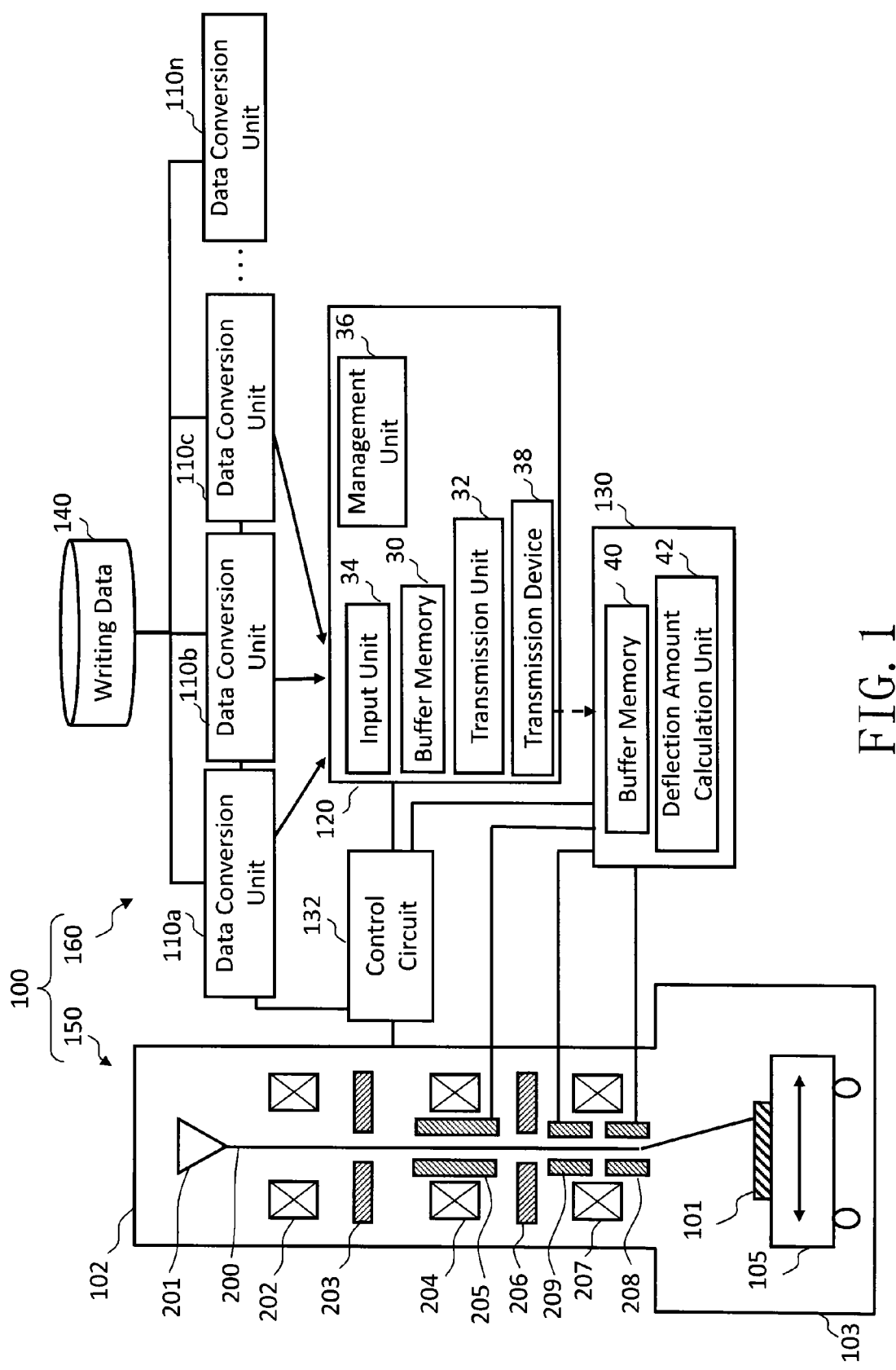
FIG. 1 is a schematic diagram showing a configuration of a writing apparatus according to the first embodiment.

FIG. 1 is a schematic diagram showing a configuration of a writing apparatus according to the first embodiment. As shown in FIG. 1, a writing (or "drawing") apparatus 100 includes a writing unit 150 and a control unit 160. The writing apparatus 100 is an example of a charged particle beam writing apparatus. Particularly, it is an example of a variable shaped electron beam writing apparatus. The writing unit 150 includes an electron optical column 102 and a writing chamber 103. In the electron optical column 102, there are arranged an electron gun assembly 201, an illumination lens 202, a first aperture plate 203, a projection lens 204, a deflector 205, a second aperture plate 206, an objective lens 207, a main deflector 208 and a sub deflector 209. In the writing chamber 103, there is arranged an XY stage 105. On the XY stage 105, a target object or "sample" 101 such as a mask serving as a writing target is placed when writing is performed. The target object 101 is, for example, an exposure mask used for manufacturing semiconductor devices. The target object 101 may be, for example, a mask blank on which resist is applied and a pattern has not yet been formed.

The control unit 160 includes a plurality of control computer units 110a-n (data conversion units), data transmission computer unit 120, a deflection control circuit 130 (deflection calculation unit), a control circuit 132, and a storage device 140 such as a magnetic disk drive. The plurality of control computer units 110a-n, the data transmission computer unit 120, the deflection control circuit 130, the control circuit 132, and the storage device 140 are mutually connected through a bus (not shown).

In each of a plurality of control computer units 110a-n, there are arranged a plurality of CPUs and a plurality of memories.

In the data transmission computer unit 120 (an example of a transmission unit), there are arranged an input unit 34, a buffer memory 30, a transmission unit 32, a transmission device 38, and a management unit 36. Functions, such as the input unit 34, the transmission unit 32, and the management unit 36 may be configured by hardware such as an electric circuit or by software such as a program causing a computer to implement these functions. Alternatively, the functions may be configured by a combination of hardware and software. Data which is input and output to/from the input unit 34, the transmission unit 32, and the management unit 36, and data being operated are stored in a memory (not shown) each time.

In the deflection control circuit 130, there are arranged a buffer memory 40 and a deflection amount calculation unit 42. Functions, such as the deflection amount calculation unit 42 may be configured by hardware such as an electric circuit or by software such as a program causing a computer to implement these functions. Alternatively, the function may be configured by a combination of hardware and software. Data which is input and output to/from the deflection amount calculation unit 42, and data being operated are stored in a memory (not shown) each time.

FIG. 1 shows a configuration necessary for explaining the first embodiment. Other configuration elements generally necessary for the writing apparatus 100 may also be included. For example, a multiple stage deflector of two stages of the main deflector 208 and the sub deflector 209 is herein used for position deflection. However, a single stage deflector or a multiple stage deflector of three or more stages may also be used for position deflection.

Writing data in which positions, sizes, and the like of a plurality of figure patterns are defined is input into the storage device 140 from the outside to be stored therein.

Figure 2:
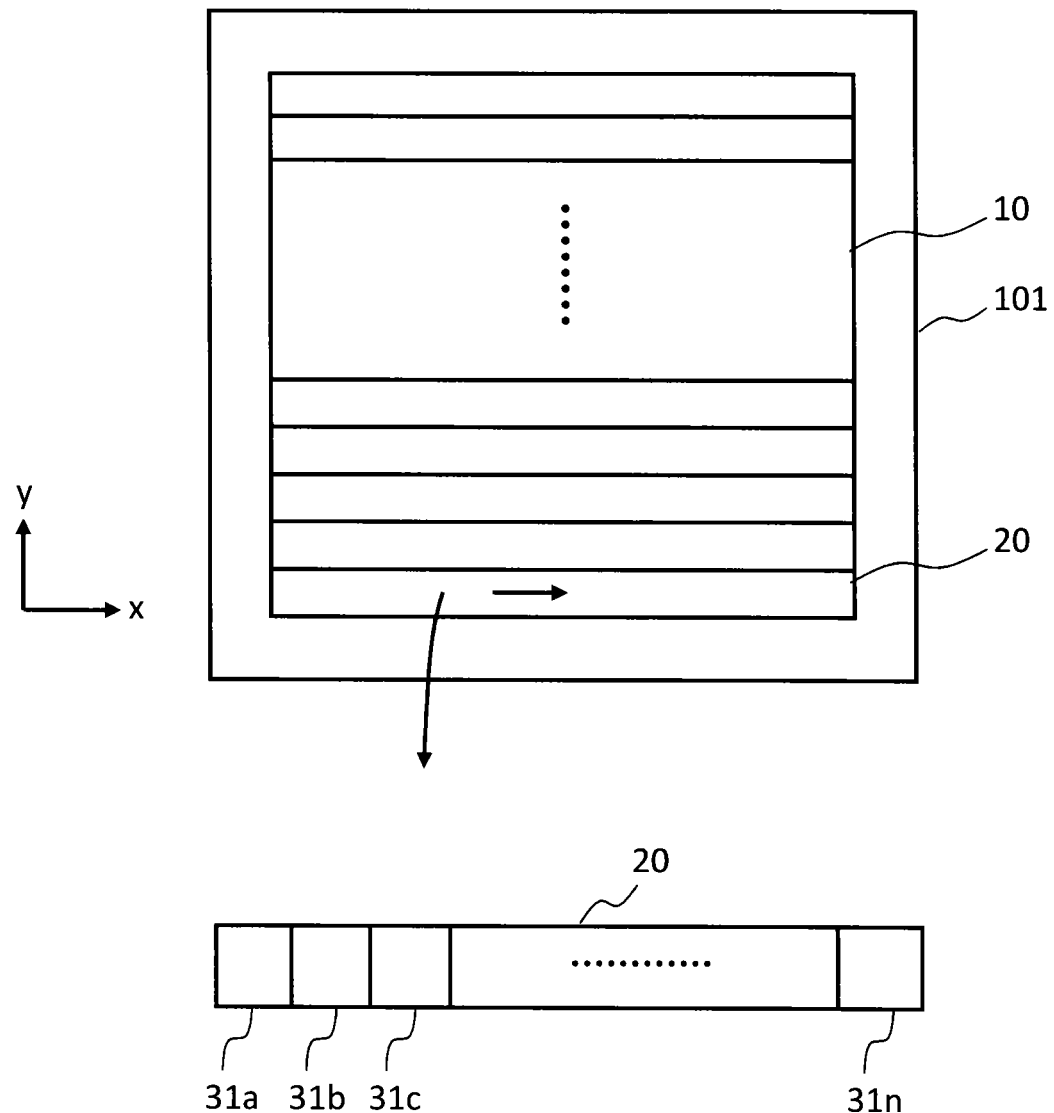
FIG. 2 shows a conceptual diagram explaining each region according to the first embodiment.

FIG. 2 shows a conceptual diagram explaining each region according to the first embodiment. In FIG. 2, a writing region 10 of the target object 101 is virtually divided into a plurality of stripe regions 20 each having a strip shape and a width deflectable in the x or y direction by the main deflector 208. Moreover, each stripe region 20 is divided into a plurality of data processing blocks (DPB) 31 (an example of a processing region).

Figure 3:
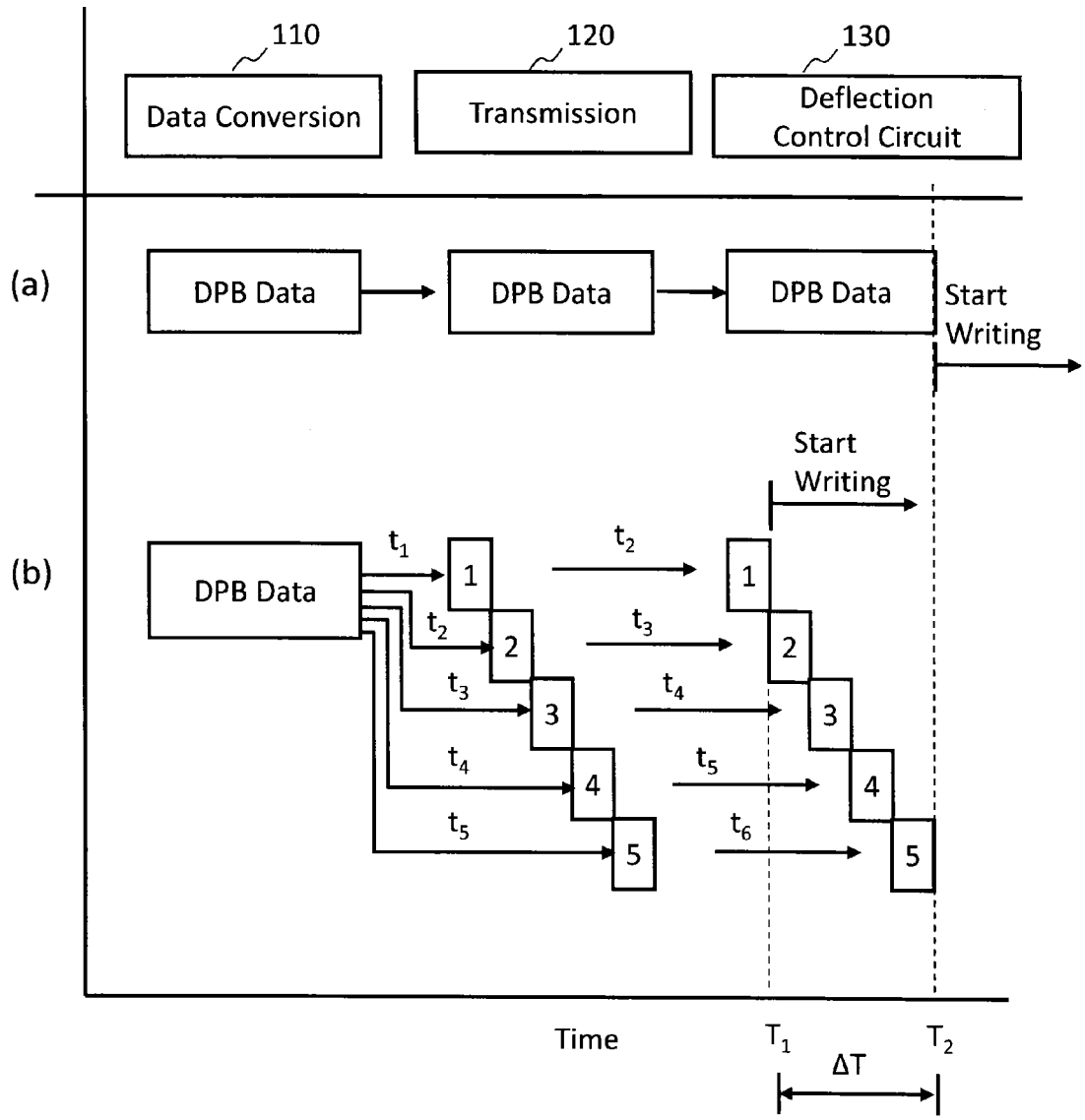
FIG. 3 is a time chart explaining a structure of data transmission according to the first embodiment.

FIG. 3 is a time chart explaining a structure of data transmission according to the first embodiment. Apart (a) of FIG. 3, as a comparative example of the first embodiment, shows the case where data is transmitted by the DPB 31. In the comparative example as shown in the part (a) of FIG. 3, data conversion processing of one DPB 31 is performed in the control computer unit 110 serving as a data conversion unit. Specifically, the CPU in the control computer unit 110 reads writing data corresponding to each DPB region 31 from the storage device 140, and performs data conversion processing of a plurality of steps to generate apparatus-specific shot data. Then, the shot data of the DPB region 31 concerned for which data conversion processing has been performed is collectively output by the DPB region 31 to the data transmission computer unit 120.

Then, in the data transmission computer unit 120, the input shot data of the DPB region 31 concerned is collectively output by the DPB region 31 to the deflection control circuit 130. In the deflection control circuit 130, writing processing does not start until transmission of shot data of each DPB region 31 has been completed. Thus, in the comparative example, writing processing cannot be started until the entire shot data of one DPB region 31 reaches the deflection control circuit 130. Therefore, if transmission processing is delayed and thus transmission of the entire shot data of the present DPB region 31 has not been completed before writing processing of the DPB region being one region before the present DPB region 31 is completed, the writing processing becomes once stopped. In the writing apparatus 100, when, for example, writing is performed while the XY stage 105 is continuously moving, if shot data of a next DPB region 31 is delayed, writing processing is once stopped.

However, since it is difficult to instantly stop the XY stage 105, the position of the stage deviates from an expected position. Therefore, when writing processing is once stopped, the stage position needs to be returned to a position where writing was performed accurately, and then, after shot data for a next DPB region 31 reaches the deflection control circuit 130, writing is started again. Therefore, if the operation is once stopped, there is a problem that time needs to be spent in restoring the state from the stopping, which makes the writing time long.

Then, according to the first embodiment, as shown in a part (b) of FIG. 3, data transmission is not performed by the DPB region 31, but shot data of the DPB region 31 for which data conversion processing has been performed is divided into a plurality of divided processing data. For example, it is divided into predetermined data amounts. In the case of the part (b) of FIG. 3, shot data of one DPB region 31 is divided into five divided processing data of 1 to 5 in order of writing. The number of divisions is not limited to five. It may be less or more than five as long as it is divided into a plurality of divided processing data.

In the data transmission computer unit 120, a part of shot data of the DPB region 31 for which data conversion processing has been performed is sequentially input, one part at a time, totally as n divided processing data. In the case of the part (b) of FIG. 3, five divided processing data of 1 to 5 is input in order of writing. In the case of the part (b) of FIG. 3, first, the data transmission computer unit 120 inputs the first divided processing data (time zone $t_1$). Next, while inputting the second divided processing data, the data transmission computer unit 120 transmits the first divided processing data to the deflection control circuit 130 (time zone $t_2$). Next, while inputting the third divided processing data, the data transmission computer unit 120 transmits the second divided processing data to the deflection control circuit 130 (time zone $t_3$). Next, while inputting the fourth divided processing data, the data transmission computer unit 120 transmits the third divided processing data to the deflection control circuit 130 (time zone $t_4$). Thus, while inputting the n-th divided processing data, the data transmission computer unit 120 transmits the (n−1)th divided processing data to the deflection control circuit 130 (time zone $t_n$). In other words, input processing and transmission processing of n divided processing data are performed by pipeline processing in order of writing. The time zones 1 to 6 show time zones arranged in order.

As described above, n divided processing data is transmitted in order. Thereby, after the time zone $t_2$ has elapsed, transmission of the first divided processing data to the deflection control circuit 130 is completed. Then, after the subsequent time zone $t_3$ has elapsed, transmission of the second divided processing data to the deflection control circuit 130 is completed. After the time zone $t_{n+1}$ being after the time zone $t_n$ has elapsed, transmission of the n-th divided processing data to the deflection control circuit 130 is completed. However, if the transmission time of divided processing data from the data transmission computer unit 120 to the deflection control circuit 130, that is the transmission time of the data transmission computer unit 120, is longer than the transmission time of divided processing data from the control computer unit 110 to the data transmission computer unit 120, that is the input time of the data transmission computer unit 120, it is sufficient for the data transmission computer unit 120 to perform transmission processing after the previous transmission processing has been completed.

In the comparative example, as shown in the part (a) of FIG. 3, it is difficult to start writing processing until the time zone $t_6$ shown in the part (b) of FIG. 3 has elapsed (time $T_2$). However, according to the first embodiment, writing processing can be started after the time zone $t_2$, that is the arrival time of the first divided processing data at the deflection control circuit 130, has elapsed (time $T_1$). Therefore, writing processing can be started earlier by the difference $\Delta T$ between the time $T_1$ and the time $T_2$. Accordingly, the stop of the writing processing due to waiting for data transmission as in the comparative example can be eliminated or reduced. The operation contents are concretely described below.

Figure 4:
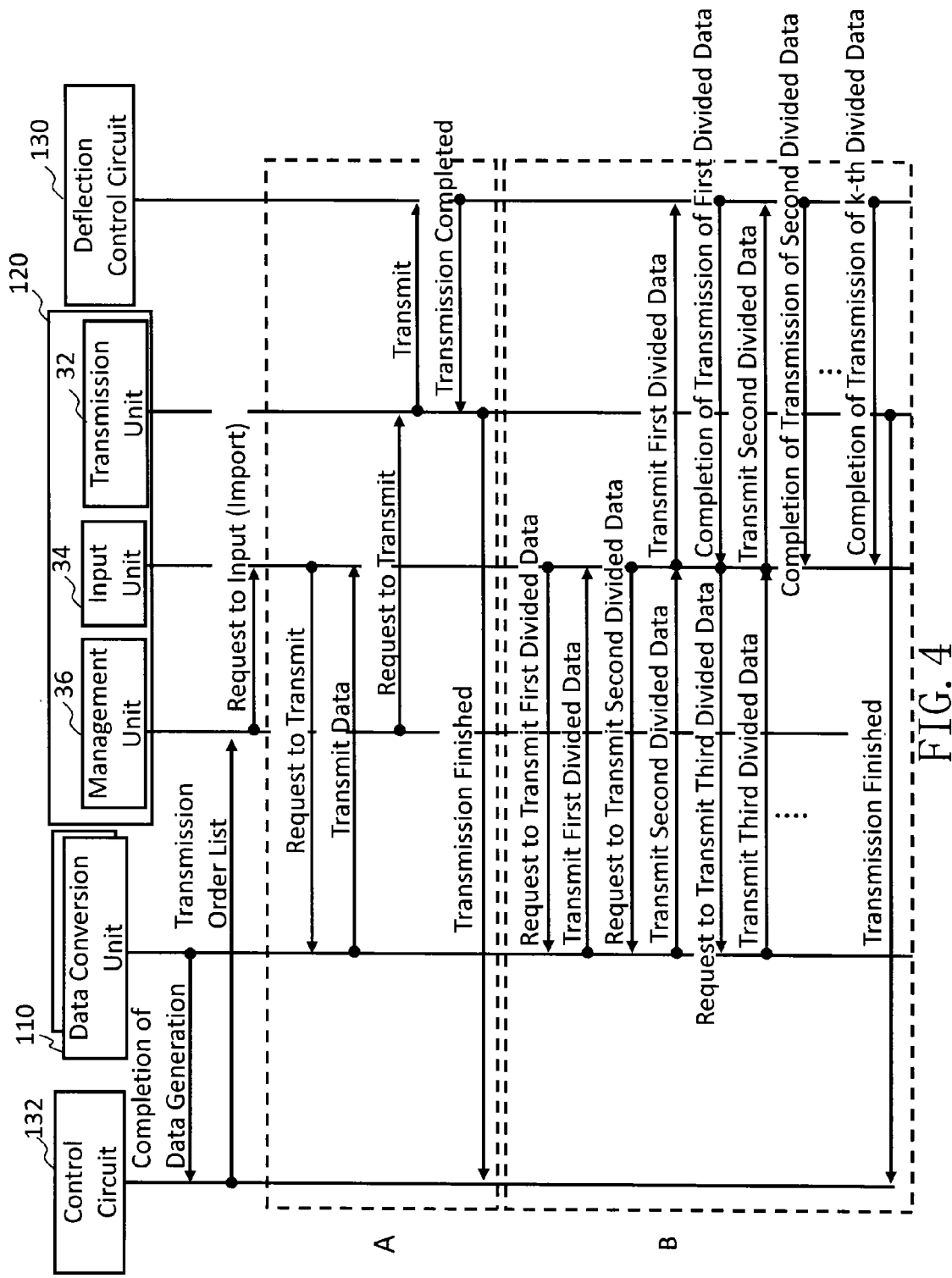
FIG. 4 is a flowchart describing a structure of data transmission according to the first embodiment.

FIG. 4 is a flowchart describing the structure of data transmission according to the first embodiment.

In a data conversion step, a plurality of control computer units 110a-n (an example of a data conversion unit or a conversion processing unit) perform data conversion processing of writing data in parallel for each DPB region 31 obtained by virtually dividing the writing region 10 of the target object 101 into a plurality of DPB regions 31 (processing regions). The CPU in each of a plurality of control computer units 110a-n reads writing data corresponding to each DPB region 31 from the storage device 140, performs data conversion processing of a plurality of steps, and generates apparatus-specific shot data. Thus, by performing data processing in parallel, the data processing can be executed at a high speed. For actually writing a figure pattern by the writing apparatus 100, it is necessary to divide each figure pattern defined in writing data into the size that can be irradiated by one beam shot. Then, the CPU in each of a plurality of data conversion units 110a-n generates a shot figure by dividing a figure pattern indicated by writing data into the size that can be irradiated by one beam shot. Shot data is generated for each shot figure. The shot data defines figure data, such as a figure type, figure size, irradiation position and dose, for example. Further, according to the first embodiment, the header of each shot data defines writing order information indicating a writing order.

Writing order information is in the header of each shot data. For example, DPB information is defined, and then, a writing order is represented by the DPB information. For example, when DPB information is defined for each stripe region 20, stripe region information is also defined. It is preferable to use, for example, an ID (identifier or address) of the DPB region, as the DPB information. Writing processing is performed for each DPB in order of increasing position indicated by the DPB region ID from the smallest, for example. Alternatively, writing processing is performed for each DPB in order of increasing distance of the position indicated by the ID from the closest to the writing starting position of each stripe region, for example. Alternatively, it is also preferable to define a number for each of a plurality of DPBs such that each number indicates the order of writing processing of a DPB concerned.

Then, figure data, such as a figure type, figure size, irradiation position, and dose, is defined after the header. Shot data calculated by the CPU in each of a plurality of control computer units 110a-n is stored in a memory corresponding to each CPU.

In a data generation completion notification transmission step, when data conversion processing in the DPB region 31 concerned has been completed in each of the control computer units 110a-n, a data generation completion notification is transmitted to the control circuit 132 from each of the control computer units 110a-n.

In a transmission order list generation step, receiving the input of the data generation completion notification from each of the control computer units 110a-n, a transmission order list is generated in the control circuit 132 (generation unit).

Figures 5, 6:
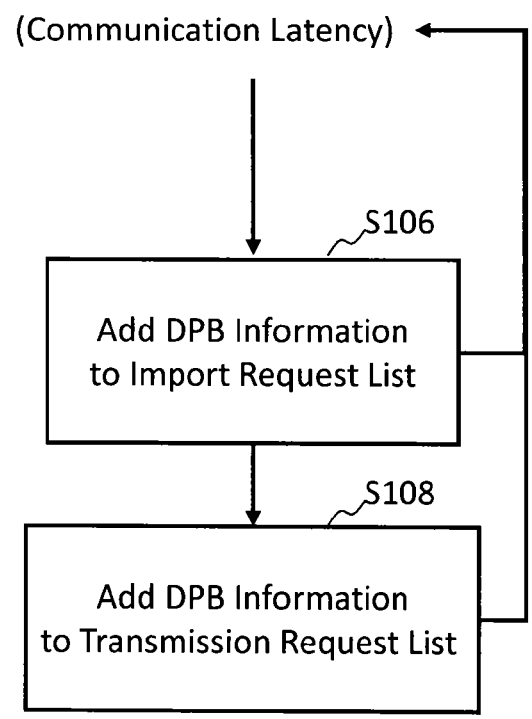
FIG. 5 shows an example of a transmission order list according to the first embodiment.
FIG. 6 shows main steps of an operational flow of a management unit according to the first embodiment.

FIG. 5 shows an example of the transmission order list according to the first embodiment. In the transmission order list, there are defined DPB region IDs and identifiers (IDs) of the control computer units 110a-n which performed data conversion processing of the DPB regions 31 indicated by the DPB region IDs. The DPB region ID defines a serial ID in the system for the entire writing region 10 of the target object 101, a number of the stripe region 20 to which the DPB region 31 concerned belongs, and a serial ID of the DPB region 31 concerned in the stripe region 20 concerned. The example of FIG. 5 shows a list in which shot data of the DPB region 31, where "31" is a serial ID in the entire writing region 10, "1" is a stripe region ID to which the DPB region having a serial number 31 belongs, and "2" is a serial ID in the stripe region 20 whose ID is "1", is defined at the head of the list. Moreover, it shows that the ID of the control computer unit 110 which performed data conversion processing in the DPB region 31 concerned is "A". Similarly, with respect to the DPB region in the second line of the list, "32" is a serial ID in the entire writing region 10, "1" is a stripe region ID to which the DPB region having a serial number 32 belongs, "2" is a serial ID in the stripe region 20 whose ID is "1", and the ID of the control computer unit 110 which performed data conversion processing is "B". Similarly, with respect to the DPB region in the third line of the list, "33" is a serial ID in the entire writing region 10, "1" is a stripe region ID to which the DPB region having a serial number 33 belongs, "2" is a serial ID in the stripe region 20 whose ID is "1", and the ID of the control computer unit 110 which performed data conversion processing is "C". That is, three DPB regions 31 having serial IDs from "31" to "33" in the entire writing region 10 are in the list of FIG. 5.

In the transmission order list, the DPB regions are arranged in order of writing. For example, with respect to a DPB region having a serial ID after "31" in the entire writing region 10, even when the data generation completion notification of a DPB region having a serial ID after "32" has been transmitted to the control circuit 132, the DPB region having the serial ID after "32" is not written in the transmission order list until the data generation completion notification of the DPB region having the serial ID "31" reaches the control circuit 132. On the contrary, when the data generation completion notification of a DPB region having a serial ID after "32" has not been transmitted to to the control circuit 132 and only the data generation completion notification of the DPB region having the serial number "31" has reached the control circuit 132, a transmission order list is generated such that only one DPB region having the serial ID "31" is defined in the list. The generated transmission order list is transmitted from the control circuit 132 to the management unit 36 in the data transmission computer unit 120.

In an input (import) request step, the management unit 36 requests the input unit 34 to input the data. Specifically, it operates as described below.

FIG. 6 shows main steps of an operational flow of the management unit according to the first embodiment.

In an addition step (S106) to an import request list, when inputting a transmission order list, an addition processing function unit (not shown) of the management unit 36 adds DPB information shown in the transmission order list to the import request list. The contents of the import request list may be the same as those of the transmission order list shown in FIG. 5. Similarly to the transmission order list, listing is performed in order of writing in the import request list.

In an addition step (S108) to a transmission request list, when inputting a transmission order list, an addition processing function unit (not shown) of the management unit 36 adds DPB information shown in the input transmission order list to another transmission order list (transmission request list) uniquely owned by the transmission unit 32. The contents of the transmission request list may be the same as those of the transmission order list shown in FIG. 5. Specifically, for example, when the first transmission order list is transmitted from the control circuit 132 to the management unit 36, the contents of the another transmission order list (transmission request list) uniquely owned by the transmission unit 32 are the same as those of the first transmission order list transmitted from the control circuit 132. If, for example, the second transmission order list is transmitted from the control circuit 132 to the management unit 36 before transmission of the DPB defined in the first transmission order list has been completed, the contents of the second transmission order list are connected to the rear of the another transmission order list (transmission request list), in the current state, uniquely owned by the transmission unit 32. Thereby, the contents of the transmission order list sequentially transmitted from the control circuit 132 are reflected to another transmission order list uniquely owned by the transmission unit 32.

That DPB information is added to an import request list indicates that the input unit 34 is requested to input data. Then, the input unit 34 operates as described below.

Figure 7:
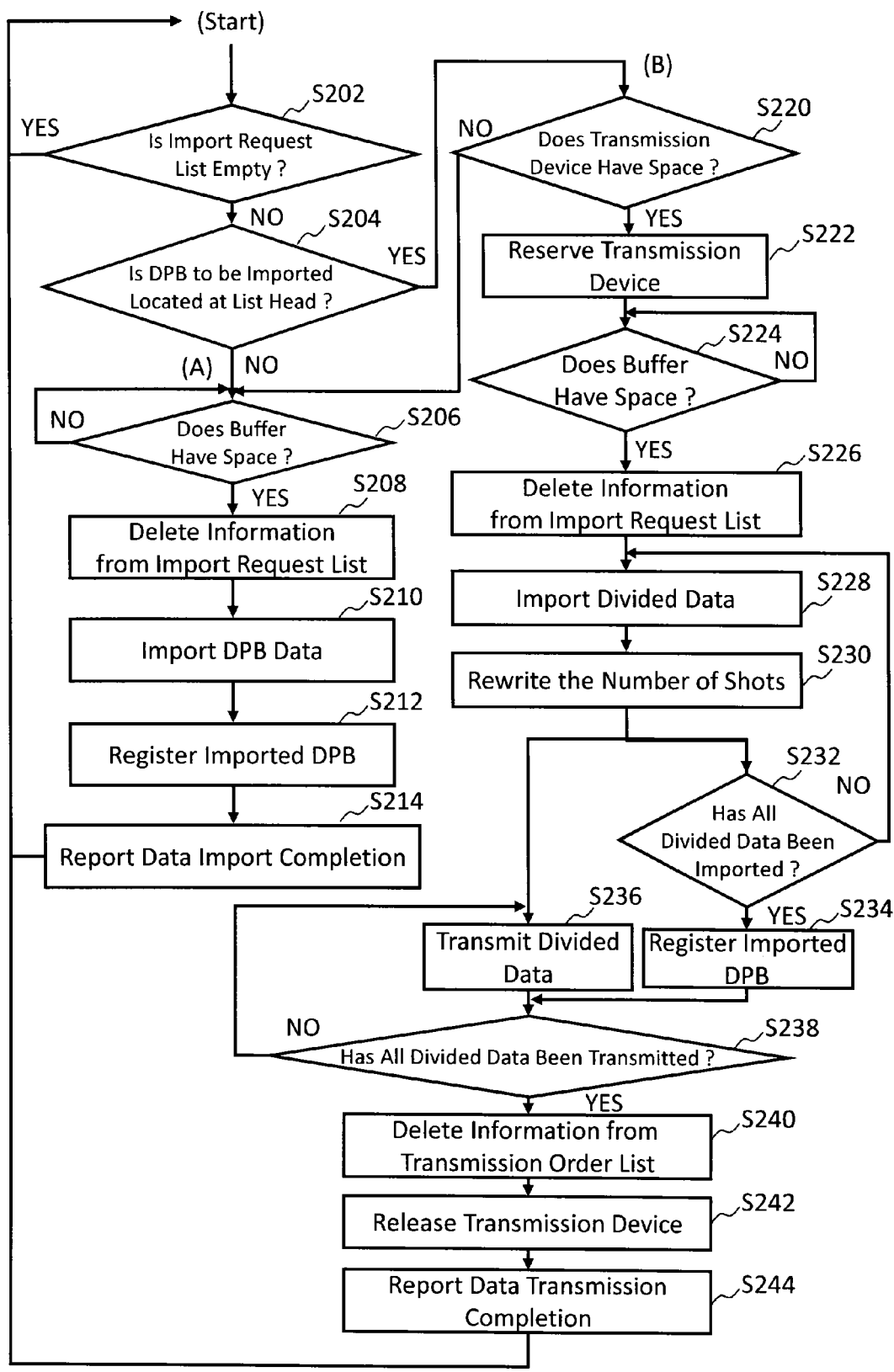
FIG. 7 shows main steps of an operational flow of an input unit according to the first embodiment.

FIG. 7 shows main steps of an operational flow of the input unit according to the first embodiment.

First, in a determination step (S202), a determination function unit (not shown) of the input unit 34 determines whether the import request list is empty (no DPB information). When the import request list is empty, it returns to the determination step (S202).

In a determination step (S204), when the import request list is not empty, a determination function unit (not shown) of the input unit 34 determines whether the DPB region whose data is to be imported is defined at the head of the transmission order list. If the DPB region is not defined at the head, it goes to flow (A), and if it is defined at the head, it goes to flow (B). The flows (A) and (B) correspond to the flows surrounded by the dotted lines of FIG. 4. That is, in the determination step (S204), one of the flows (A) and (B) is to be selected. The flow (A) shows a flow of collectively performing transmission processing of the entire shot data of the DPB region. The flow (B) shows a flow of dividing shot data of the DPB region into a plurality of divided processing data, and sequentially transmitting a plurality of divided processing data. First, the flow (A) is described below.

In a determination step (S206), a determination function unit (not shown) of the input unit 34 determines whether the buffer memory 30 has a space for storing the entire shot data of the DPB region 31 concerned. When there is no space, it returns to the determination step (S206).

In a deletion step (S208) from a list, a deletion function unit (not shown) of the input unit 34 deletes information on the target DPB region from the import request list.

In an import step (S210), first, a transmission function unit (not shown) of the input unit 34 sends a request to the control computer unit 110 which performed data conversion of the target DPB region to transmit shot data of the target DPB region. The control computer unit 110 to be an object can be identified by ID of the control computer unit 110 defined in the import request list (or transmission order list). The control computer unit 110 concerned transmits shot data of the target DPB region to the input unit 34. Thereby, an import function unit (not shown) of the input unit 34 inputs (imports) shot data of the target DPB region from the control computer unit 110 concerned. The input shot data of the target DPB region is temporarily stored (recorded) in the buffer memory 30.

In a registration step (S212), a registration function unit (not shown) of the input unit 34 registers the target DPB region whose shot data has been input into the input unit 34, as an imported DPB.

In a report step (S214), a transmission function unit (not shown) of the input unit 34 reports the management unit 36 that importing shot data of the target DPB region has been completed. Then, it returns to the determination step (S202). Each step after the determination step (S202) is repeated until the import request list becomes empty.

Next, the flow (B) is described below. When determined in the determination step (S204) that the DPB region whose data is to be imported is defined at the head of the transmission order list, there is a high possibility at that time that the transmission unit 32 has not transmitted the shot data of the DPB region. Therefore, shot data transmission of the DPB region is likely to be delayed. Then, according to the first embodiment, when the DPB region for which input processing is to be started is located at the head of the transmission order list, the input unit 34 inputs processing data of the DPB region concerned in order, as n divided processing data, and transmits them in order. In the flow (B), the input unit 34 instead of the transmission unit 32 carries out processing of transmission to the deflection control circuit. In such a case, the input unit 34 serves as an example of the transmission unit.

In a determination step (S220), a determination function unit (not shown) of the input unit 34 determines whether the transmission device 38 is in use or not at the time. If the transmission device 38 is in use and unavailable, it goes to the determination step (S206). If the transmission device 38 is in use, since it means that the shot data transmission of the DPB region is not delayed, there is no necessity of daring to carry out division into divided processing data. Therefore, what is necessary is just to return to the usual flow (A).

In a reservation step (S222), when the transmission device 38 is not in use, a reservation function unit (not shown) of the input unit 34 provides a transmission device reservation in order to use the transmission device 38.

In a determination step (S224), a determination function unit (not shown) of the input unit 34 determines whether the buffer memory 30 has a space for storing the divided processing data of the DPB region 31 concerned. If there is no sufficient space, it returns to the determination step (S224). Since the data amount of the divided processing data is sufficiently smaller than that of the entire shot data of one DPB region 31, the determination threshold value used here may be smaller than the determination threshold value used in the determination step (S206). For example, it is sufficient that a space capable of storing at least two or more divided processing data remains.

In a deletion step (S226) from a list, a deletion function unit (not shown) of the input unit 34 deletes information on the target DPB region from the import request list.

In a divided data import step (S228), first, a transmission function unit (not shown) of the input unit 34 sends a request to the control computer unit 110 which performed data conversion of the target DPB region to transmit the n-th divided processing data of shot data of the target DPB region. Here, since it is the beginning, a request to transmit the first divided processing data is sent. The control computer unit 110 to be an object can be identified by ID of the control computer unit 110 defined in the import request list (or transmission order list). The control computer unit 110 concerned transmits the n-th divided processing data of shot data of the target DPB region to the input unit 34. Thereby, an import function unit (not shown) of the input unit 34 inputs (imports) the n-th divided processing data of shot data of the target DPB region from the control computer unit 110 concerned. The input n-th divided processing data of shot data of the target DPB region is temporarily stored (recorded) in the buffer memory 30.

Here, the writing unit 150 incudes the main deflector 208 and the auxiliary deflector 209 that deflect an electron beam 200 to the target object 101. A plurality of mesh subfields (SF) deflectable by the main deflector 208 and the auxiliary deflector 209 are set in the DPB region 31. Moreover, the number of shots in a subfield is defined in shot data (processing data), for each subfield. For example, a subfield header is defined for each subfield, and the subfield header defines an ID indicating the address of the subfield concerned and the number of shots of the electron beam to be shot in the the subfield concerned. However, when dividing of shot data into a plurality of divided processing data is performed by the desired size, it may be divided in the middle of the subfield. If dividing is defined by the data size, the possibility of being divided in the middle of the subfield may be higher than that of not being divided in the middle of it. Therefore, if divided in the middle of a subfield, one of divided processing data includes the subfield header of the subfield which has been divided, but the number of shots assigned by the division differs from the number of shots originally defined in the subfield header. The other of divided processing data includes no subfield header of the subfield which has been divided, and the number of shots assigned by the division is not defined in the data. Then, for this insufficient data structure, correction is performed as described below.

In a rewrite step (S230), with respect to one of divided processing data generated due to division in the middle of the subfield, a rewrite function unit (not shown) of the input unit 34 rewrites the number of shots which is originally defined for the subfield that has been divided and is defined in the divided processing data concerned to the number of shots assigned to the divided processing data concerned by the division. Moreover, with respect to the other of divided processing data which was also generated due to the division in the middle of the subfield and is to be input next, the rewrite function unit (not shown) of the input unit 34 generates a subfield header of the divided subfield after being input, and writes (defines) the number of shots assigned to the divided processing data concerned by the division in the generated subfield header. By this processing, information omitted or changed by the division can be corrected in each divided processing data.

In a determination step (S232), a determination function unit (not shown) of the input unit 34 determines whether all the divided processing data of the DPB region concerned has been imported. If there still remains divided processing data that has not been imported in all the divided processing data of the DPB region concerned, it returns to the divided data import step (S228). Then, importing of next divided processing data is performed in the divided data import step (S228). Each step from the divided data import step (S228) to the determination step (S232) is repeated until all the divided processing data has been imported.

In a registration step (S234), when all the divided processing data of the DPB region concerned has been imported, a registration function unit (not shown) of the input unit 34 registers an input target DPB region as an imported DPB, and then it goes to a determination step (S238).

In a divided data transmission step (S236), a transmission function unit (not shown) of the input unit 34 transmits divided processing data that has been input earlier to the deflection control circuit 130. In this case, for example, it is preferable to start transmission to the deflection control circuit 130 immediately after the first divided processing data has been input and the rewrite step (S230) has been completed. The transmission processing is actually performed by the transmission device 38, based on the control from the transmission function unit (not shown) of the input unit 34.

In a determination step (S238), a determination function unit (not shown) of the input unit 34 determines whether all the divided processing data of the DPB region concerned has been transmitted. If there still remains divided processing data that has not been transmitted in all the divided processing data of the DPB region concerned, it returns to the divided data transmission step (S236). Then, transmission of next divided processing data is executed in the divided data transmission step (S236). Each step from the divided data transmission step (S236) to the determination step (S238) is repeated until all the divided processing data has been transmitted.

According to the first embodiment, as described referring to FIG. 3, the input unit 34 (an example of the transmission unit) inputs a part of shot data of the DPB region for which data conversion processing has been performed, one part at a time, totally as n divided processing data, and sequentially transmits the n divided processing data in a manner such that the (n−1)th divided processing data is transmitted while the n-th divided processing data is being input.

In a list deletion step (S240), a deletion function unit (not shown) of the input unit 34 deletes information on a target DPB region from a transmission order list uniquely owned by the transmission unit 32.

In a device release step (S242), a release function unit (not shown) of the input unit 34 releases a reserved transmission device 38.

In a report step (S244), a transmission function unit (not shown) of the input unit 34 reports to the control circuit 132 and the management unit 36 that transmission of shot data of a target DPB region has been completed. Then, it returns to the determination step (S202). Each step after the determination step (S202) is repeated until the import request list becomes empty.

Next, operations of the transmission unit 32 will be described. When the transmission order list uniquely owned by the transmission unit 32 is not empty, data transmission is requested to the transmission unit 32. The transmission unit 32 operates as described below.

Figure 8:
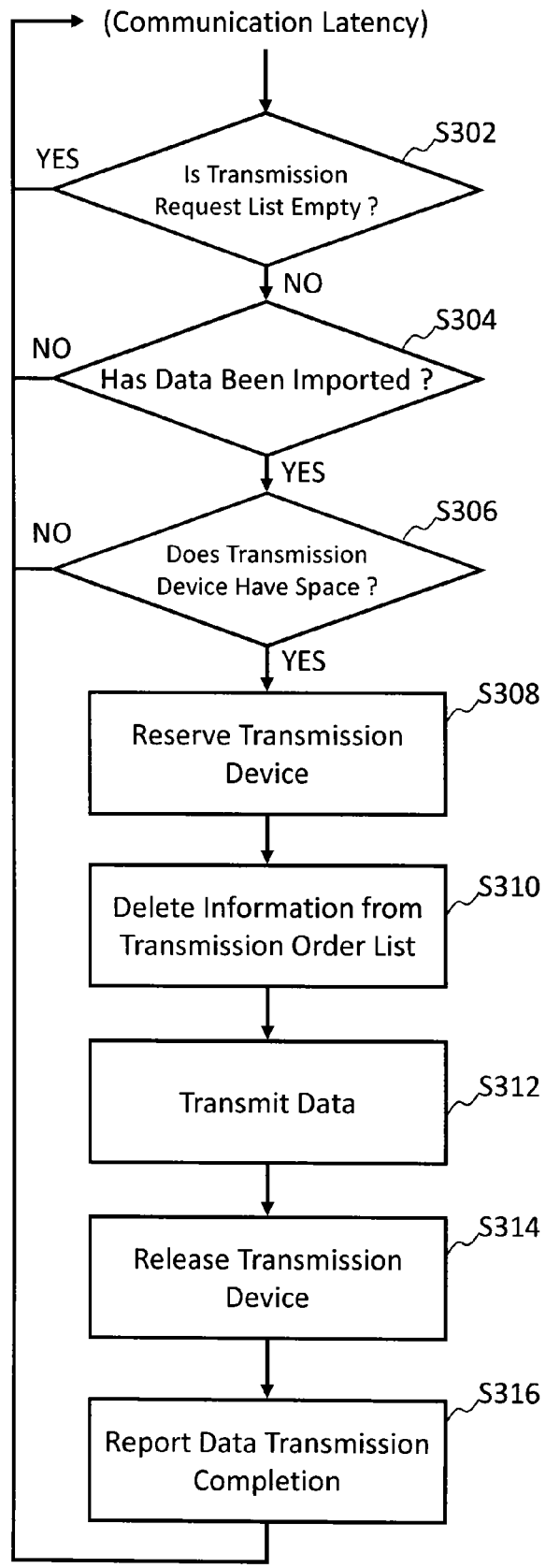
FIG. 8 shows main steps of an operational flow of a transmission unit according to the first embodiment.
Figure 9:
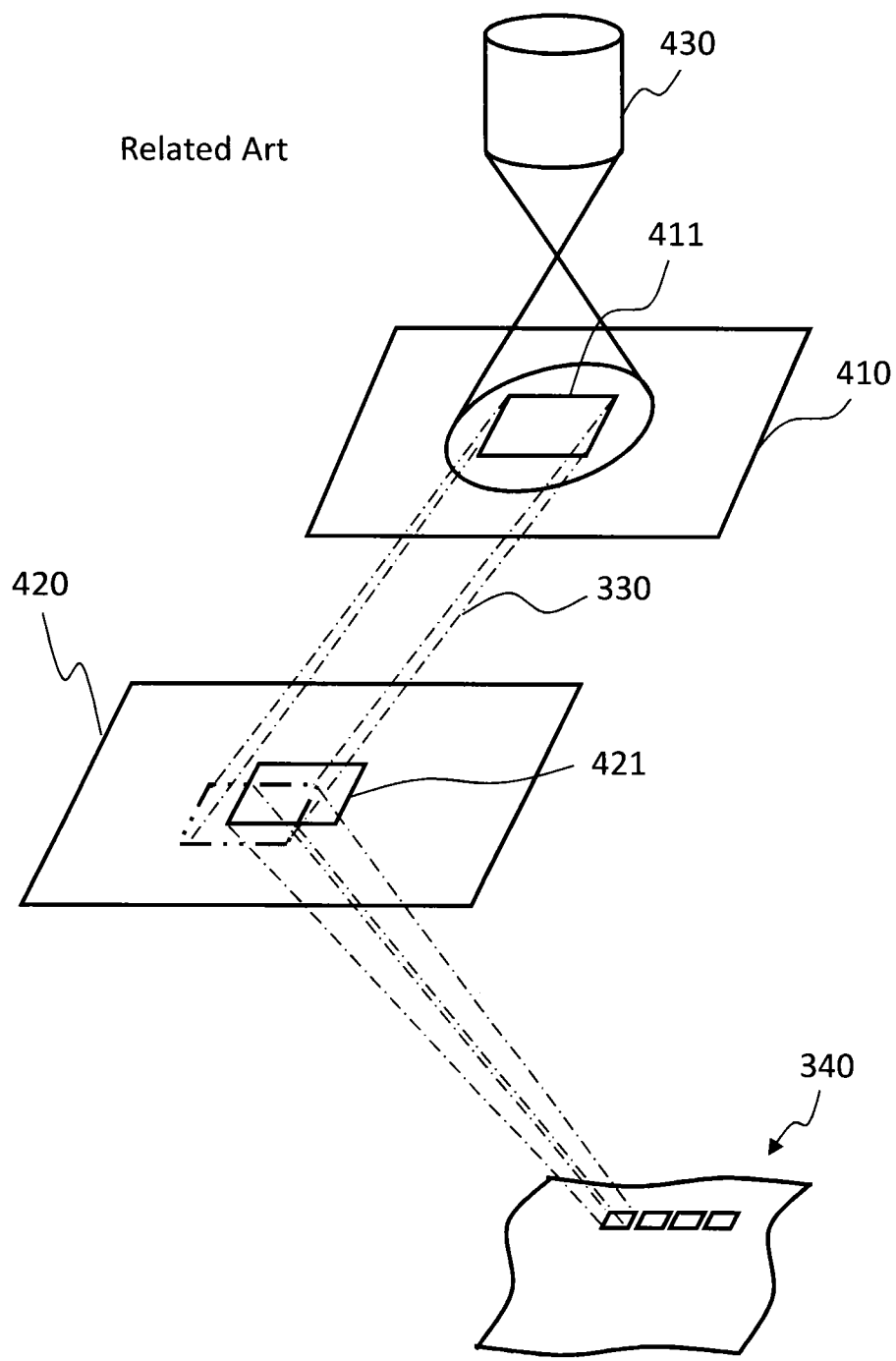
FIG. 9 is a conceptual diagram explaining operations of a variable shaped electron beam writing apparatus.

FIG. 8 shows main steps of an operational flow of the transmission unit according to the first embodiment. The transmission unit 32 operates when the flow (A) of FIG. 4 is performed. First, in a determination step (S302), a determination function unit (not shown) of the transmission unit 32 determines whether the transmission request list is empty (no DPB information). When the transmission request list is empty, it returns to the determination step (S302).

In a determination step (S304), when a transmission order list uniquely owned by the transmission unit 32 is not empty, a determination function unit (not shown) of the transmission unit 32 determines whether shot data of the DPB region which is defined at the head of the transmission order list has already been imported into the buffer memory 30. When the shot data of the DPB region defined at the head has not been imported, it returns to the determination step (S302).

In a determination step (S306), when the shot data of the DPB region defined at the head has already been imported, a determination function unit (not shown) of the transmission unit 32 determines whether the transmission device 38 is not in use at the time. When the transmission device 38 is in use and unavailable, it returns to the determination step (S302).

In a reservation step (S308), when the transmission device 38 is not in use, a reservation function unit (not shown) of the transmission unit 32 provides a transmission device reservation in order to use the transmission device 38.

In a list deletion step (S310), a deletion function unit (not shown) of the transmission unit 32 deletes information on the target DPB region from the transmission order list uniquely owned by the transmission unit 32.

In a data transmission step (S312), a transmission function unit (not shown) of the transmission unit 32 transmits the shot data of the DPB region, which is defined at the head of the transmission order list uniquely owned by the transmission unit 32 and has already been imported, to the deflection control circuit 130. Based on the control from the transmission function unit (not shown) of the transmission unit 32, transmission processing is actually performed by the transmission device 38.

In a device release step (S314), a release function unit (not shown) of the transmission unit 32 releases a reserved transmission device 38.

In a report step (S316), a transmission function unit (not shown) of the transmission unit 32 reports to the control circuit 132 and the management unit 36 that transmission of shot data of the target DPB region has already been completed. Then, it returns to the determination step (S302). Each step after the determination step (S302) is repeated until the transmission order list uniquely owned by the transmission unit 32 becomes empty.

As described above, shot data of each DPB region is temporarily stored in the buffer memory 40 in the deflection control circuit 130 in a manner such that the entire shot data of each DPB region is collectively stored, or shot data of each DPB region is divided into a plurality of divided processing data to be sequentially stored. Accordingly, shot data or divided processing data of the DPB region 31 can be stored without any delay, in the order of writing processing, in the buffer memory 40 of the deflection control circuit 130.

The deflection control circuit 130 controls a deflection amount for deflecting an electron beam, based on shot data or divided processing data having been transmitted sequentially.

In a deflection amount calculation step, the deflection amount calculation unit 42 reads processing data (shot data or divided processing data) from the buffer memory 40 in order of writing, and calculates deflection amounts to be deflected by the deflector 205, the main deflector 208, and the sub deflector 209 respectively. Then, a digital signal indicating a deflection amount is output to a digital-analog conversion (DAC) amplifier unit (not shown) for each deflector. Then, in each DAC amplifier unit, the digital signal output from the deflection control circuit 130 is converted to an analog signal and amplified to be applied as a deflection voltage to the deflector 205, the main deflector 208, or the sub deflector 209. Thus, the deflection control circuit 130 controls the deflection amount for deflecting the electron beam 200, based on processing data for each DPB region 31 transmitted from the data transmission computer unit 120.

In a writing step, the writing unit 150 controlled by the control circuit 132 writes a pattern on the target object 101 by deflecting the electron beam 200 based on the deflection amount. Specifically, it operates as described below.

The electron beam 200 emitted from the electron gun assembly 201 (emission unit) irradiates the whole of the first aperture plate 203 having a quadrangular opening by the illumination lens 202. At this point, the electron beam 200 is shaped to be a quadrangle. Then, after having passed through the first aperture plate 203, the electron beam 200 of a first aperture image is projected onto the second aperture plate 206 by the projection lens 204. The first aperture image on the second aperture plate 206 is deflected and controlled by the deflector 205 so as to change the shape and size of the beam to be variably shaped. After having passed through the second aperture plate 206, the electron beam 200 of a second aperture image is focused by the objective lens 207, and deflected by the main deflector 208 and the sub deflector 209 to reach a desired position on the target object 101 placed on the XY stage 105 which moves continuously. FIG. 1 shows the case of using multiple stage deflection of the main and sub deflection for position deflection. In such a case, the main deflector 208 deflects the electron beam 200 of a shot concerned to a reference position in a subfield (SF), which is obtained by virtually dividing the writing region of the target object by the main deflector 208, while following the movement of the stage, and the sub deflector 209 deflects the shot beam concerned to each irradiation position in the SF.

According to the first embodiment, as described above, data transmission to the deflection control circuit 130 can be performed without any delay. Therefore, writing processing can be smoothly carried out.

The embodiment has been explained referring to concrete examples described above. However, the present invention is not limited to these specific examples.

While the apparatus configuration, control method, and the like not directly necessary for explaining the present invention are not described, some or all of them can be selectively used case-by-case basis. For example, although description of the configuration of the control unit for controlling the writing apparatus 100 is omitted, it should be understood that some or all of the configuration of the control unit can be selected and used appropriately when necessary.

In addition, any other charged particle beam writing apparatus and charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus, comprising:
a plurality of conversion processing units configured to perform data conversion processing in parallel for writing data of each processing region obtained by virtually dividing a writing region of a target object into a plurality of processing regions;
a transmission unit configured to input a part of processing data of one of the plurality of processing regions for which the data conversion processing has been performed, one part at a time, totally as n divided processing data, and sequentially transmit the n divided processing data in a manner such that an (n−1)th divided processing data is transmitted while an n-th divided processing data is being input;
a deflection control circuit configured to control a deflection amount for deflecting a charged particle beam, based on one of the n divided processing data transmitted sequentially; and
a writing unit configured to write a pattern on a target object by deflecting the charged particle beam based on the deflection amount,
wherein processing data of one processing region for which the data conversion processing is performed by one of the plurality of conversion processing units is divided into the n divided processing data.

2. The apparatus according to claim 1, wherein input processing and transmission processing for the n divided processing data are performed by pipeline processing in order of writing.

3. The apparatus according to claim 1, wherein
the writing unit includes a deflector for deflecting the charged particle beam to the target object,
a plurality of subfields each to be deflected by the deflector are set in each of the plurality of processing regions,
a number of shots for each of the plurality of subfields is defined in the processing data, for each of the plurality of subfields, and
the transmission unit, with respect to divided processing data generated due to division in a middle of one of the plurality of subfields in one of the plurality of processing regions, rewrites the number of shots which is originally defined for the one of the plurality of subfields that has been divided and is defined in the divided processing data to a number of shots assigned to the divided processing data by the division.

4. The apparatus according to claim 1, wherein
the transmission unit inputs a transmission order list in which the plurality of processing regions are arranged and defined in order of data transmission, and when one of the plurality of processing regions which is to be input is located at a head of the transmission order list, inputs processing data of the one of the plurality of processing regions sequentially totally as the n divided processing data, and transmits the n divided processing data sequentially.

5. The apparatus according to claim 4, further comprising:
a generation unit configured to generate the transmission order list, wherein,
the transmission order list defines an identifier of one of the plurality of processing regions, and an identifier of one of the plurality of conversion processing units which performed data conversion processing of the one of the plurality of processing regions.

6. The apparatus according to claim 5, wherein
the one of the plurality of conversion processing units which completed the data conversion processing of the one of the plurality of processing regions transmits a data generation completion notification to the generation unit,
the writing region of the target object is virtually divided into a plurality of stripe regions,
serial identifiers are defined for processing regions, belonging to each of the plurality of stripe regions, in the plurality of processing regions, and
even when a data generation completion notification of one of the plurality of processing regions whose serial identifier is k has been transmitted to the generation unit, the one of the plurality of processing regions whose serial identifier is k is not defined in the transmission order list until a data generation completion notification of one of the plurality of processing regions whose serial identifier is (k−1) reaches the generation unit.

7. A charged particle beam writing method, comprising:
performing data conversion processing in parallel for writing data of each processing region obtained by virtually dividing a writing region of a target object into a plurality of processing regions;
inputting a part of processing data of one of the plurality of processing regions for which the data conversion processing has been performed, one part at a time, totally as n divided processing data, and sequentially transmitting the n divided processing data to a deflection control circuit in a manner such that an (n−1)th divided processing data is transmitted while an n-th divided processing data is being input;
calculating, by the deflection control circuit, a deflection amount for deflecting a charged particle beam, based on one of the n divided processing data transmitted sequentially; and
writing a pattern on a target object by deflecting the charged particle beam based on the deflection amount,
wherein processing data of one processing region for which the data conversion processing is performed by one of a plurality of conversion processing units is divided into the n divided processing data.

8. The method according to claim 7, further comprising:
inputting a transmission order list in which the plurality of processing regions are arranged and defined in order of data transmission, wherein
inputting sequentially, when one of the plurality of processing regions which is to be input is located at a head of the transmission order list, processing data of the one of the plurality of processing regions, totally as the n divided processing data, and transmitting the n divided processing data sequentially.

9. The method according to claim 8, further comprising:
inputting collectively, when one of the plurality of processing regions which is to be input is not located at the head of the transmission order list, whole processing data of the one of the plurality of processing regions and transmitting the whole processing data.

10. The method according to claim 7, further comprising:
transmitting a data generation completion notification with respect to the one of the plurality of processing regions for which the data conversion processing has been completed in the plurality of processing regions;
generating, when inputting the data generation completion notification, a transmission order list in which the plurality of processing regions for each of which the data conversion processing has been completed are arranged and defined in order of data transmission; and
requesting, when inputting the transmission order list, to import data of the one of the plurality of processing regions for which the data conversion processing has been completed.

* * * * *